United States Patent

Wu

[11] Patent Number: 6,096,613
[45] Date of Patent: Aug. 1, 2000

[54] METHOD FOR POLY-BUFFERED LOCOS WITHOUT PITTING FORMATION

[75] Inventor: Shye-Lin Wu, Hsinchu, Taiwan

[73] Assignee: Acer Semiconductor Manufacturing Inc., Hsinchu, Taiwan

[21] Appl. No.: 09/105,337

[22] Filed: Jun. 26, 1998

[51] Int. Cl.[7] .............................................. H01L 21/8238
[52] U.S. Cl. .......................... 438/297; 438/410; 438/439; 438/448; 438/770; 438/225; 148/DIG. 116; 148/DIG. 117
[58] Field of Search ..................... 438/225, 297, 438/410, 439, 448, 770, 229, FOR 229; 148/DIG. 116, DIG. 117

[56] References Cited

U.S. PATENT DOCUMENTS

| | | | |
|---|---|---|---|
| 5,358,892 | 10/1994 | Rolfson | 437/70 |
| 5,612,249 | 3/1997 | Sun et al. | 437/69 |
| 5,633,191 | 5/1997 | Chao | 438/448 |
| 5,677,234 | 10/1997 | Koo et al. | 437/69 |
| 5,686,348 | 11/1997 | Chao | 437/70 |
| 5,714,414 | 2/1998 | Lee et al. | 438/452 |
| 5,747,357 | 5/1998 | Su | 437/69 |
| 5,814,551 | 9/1998 | Park et al. | 438/448 |

FOREIGN PATENT DOCUMENTS

| | | | |
|---|---|---|---|
| 406132283 | 5/1994 | Japan | 438/FOR 229 |
| 406275605 | 9/1994 | Japan | 438/FOR 229 |
| 406275609 | 9/1994 | Japan | 438/FOR 229 |
| 406275610 | 9/1994 | Japan | 438/FOR 229 |

OTHER PUBLICATIONS

Nishihar T., et al., "A .05 microm Isolation . . . Pad LOCOS (APPL)", IEDM, 1998.
Andres, B, et al., "Characterstics of . . . for the ULSI Age", IEDM, 1994.
Nagel, J., et al., "Stress–Induced Void Formation . . . Local Oxidation of Silicon", J. Electrochem. Soc., vol. 140, No. 8. Aug. 1993.

*Primary Examiner*—Peter Toby Brown
*Assistant Examiner*—Long Pham
*Attorney, Agent, or Firm*—Harness, Dickey & Pierce, P.L.C.

[57] ABSTRACT

The present invention proposes a method for fabricating field oxide regions for isolation by an improved poly-buffered local oxidation of silicon (PBLOCOS) process. A polysilicon layer is utilized to reduce the bird's beak, and a thin thermal oxide film is formed on the buffered polysilicon film to prevent pitting formation. Forming a thin pad oxide and a silicon layer, a thermal oxidation is carried out to grow another pad oxide on the silicon layer and crystallize the silicon into polysilicon. The buffered layer of stacked oxide-polysilicon-oxide layer is thus formed. The silicon nitride layer is then deposited on the stacked buffered layer and the active areas are defined. A thermal oxidation is now performed, and thick field oxide regions are grown. After the masking nitride layer and the stacked buffered layer are stripped, the MOS devices are fabricated, and thus complete the present invention.

20 Claims, 2 Drawing Sheets

METHOD FOR POLY-BUFFERED LOCOS WITHOUT PITTING FORMATION

BACKGROUND OF THE INVENTION

1. Field of the Invention

The present invention relates to a method for forming isolation regions and, more particularly, to a method of poly-buffered local oxidation of silicon isolation.

2. Description of the Prior Art

For building an integrated circuit operating with desired action, it is necessary to fabricate many active devices on a single semiconductor substrate. Various kinds of devices with different functions, such as transistors, resistors and capacitors, are formed together. Each of the devices on the substrate must be electrically isolated from the others to ensure their individual function. The art of isolating semiconductor devices becomes one important aspect of modern metal-oxide-semiconductor (MOS) and bipolar integrated circuit technology for the separation of different devices or different functional regions. With the high integration of the semiconductor devices, improper isolation among devices will cause current leakage and the current leakage can consume a significant amount of power. Improper isolation will result in circuit latch-up, which can destroy the circuit temporarily or even permanently. In addition, improper isolation can cause degradation in circuit noise margin, voltage shift and crosstalk.

Local oxidation of silicon (LOCOS) is one of the most well-known techniques for isolation. LOCOS provides the isolation by oxidizing the silicon substrate to create silicon dioxide regions among active devices or functional regions. Because it is easy for the silicon substrate to be oxidized into silicon dioxide, LOCOS has the benefits of its process simplicity and low cost, and has become the most widely used isolation technique in very large scale integrated (VLSI) circuit. However, with the tendency for the manufacture of semiconductor integral circuit to high package density, LOCOS meets the limitation in its scalability.

In the paper "Characteristics of CMOS Device Isolation for the ULSI Age" in IEDM Tech. Dig., p. 671, 1994, by A. Bryant, et al., the two different isolation techniques of LOCOS and STI are investigated. The paper reviews how LOCOS and STI isolations are being improved to meet the scaling requirements for abrupt active-isolation transitions, isolation depth, and isolation planarity. For deep sub-micron CMOS generation, the conventional LOCOS isolation suffers from several drawbacks such as the large lateral extent of bird's beak, non-planarity, local field oxide thinning effect, and stress-induced silicon defects. The key challenges to LOCOS scaling are insulator thinning at narrow dimension, bird's beak formation, and field-implant encroachment. For future CMOS technology, an effective device isolation method that provides abrupt transitions to active device regions with minimum impact on device characteristics or topography will be required.

The main issue of the LOCOS is the unavoidable lateral oxidation of silicon under the masking nitride layer, which narrows the active device area and is often referred to as the "bird's beak". In order to suppress the lateral diffusion of oxidants for reducing the bird's beak, the pad oxide layer should be thinned to a minimum thickness. A polysilicon layer has been employed to be a buffered layer instead of pad oxide for optimization between nitride stress relief and pad oxide thinning. Polysilicon-buffered LOCOS is therefore developed to be an improved method for conventional LOCOS to suppress the lateral bird's beak. As described by T. Nishihara, et al., in their paper titled "A 0.5 μm Isolation Technology Using Advanced Poly Silicon Pad LOCOS (APPL)", IEDM Tech. Dig., p. 100, 1988, the PBLOCOS simply use a polysilicon layer to take over the buffered function of pad oxide. The effect of bird's beak can thus be reduced as the thickness of the pad oxide layer is minimized.

Although it can reduce the bird's beak effect, the PBLOCOS still encounter some problems such as the pitting formation, which is mentioned by J. Nagel, et al., in the paper "Stress-Induced Void Formation in Interlevel Polysilicon Film during Polybuffered Local Oxidation of Silicon", J. Electrochem. Soc., vol. 140, p. 2356, 1993. During the wet etching process to form the masking nitride layer by hot phosphoric acid, the etchant also attacks the underlying polysilicon in the vicinity of the field oxide. This results in damages to the substrate. The pit formation is also found in the buffer polysilicon after wet nitride removal and in silicon substrate after polysilicon etching. It is attributed to a chemical reaction of water, ammonia, and silicon during wet field oxidation, similar to the so-called white-ribbon effect. The mechanism of this reaction is investigated by T. T. Sheng, et al., in the paper "From White Ribbon to Black Belt: A Direct Observation of the Kooi Effect Masking Film by Transmission Electron Microscopy", J. Electrochem. Soc., vol. 140, p. L.163, 1993. This mechanism induces damages to the substrate and results in yield loss in deep submicron devices, which is what the present invention tries to avoid.

SUMMARY OF THE INVENTION

An improved poly-buffered local oxidation of silicon (PBLOCOS) process is disclosed for fabricating field oxide regions for isolation on a semiconductor substrate. A polysilicon layer is utilized to reduce the bird's beak, and a thin thermal oxide film is formed on the buffered polysilicon film to prevent pitting formation.

Forming a thin pad oxide and a silicon layer on a semiconductor substrate, a thermal oxidation is carried out in a dry $O_2$, $N_2O$ or NO ambient to grow another pad oxide layer on the silicon layer and crystallize the silicon layer into polysilicon layer. The buffered layer of stacked oxide-polysilicon-oxide layer is thus formed. The silicon nitride layer is then deposited on the stacked buffered layer and then the active areas are defined by a photoresist photolithography followed by an anisotropic nitride etching. A high temperature oxidation is now performed, and thick field oxide regions are grown. After the masking nitride layer and the stacked buffered layer are stripped, the MOS devices are fabricated on the semiconductor substrate by standard processes, and thus complete the present invention.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

The present invention proposes an improved poly-buffered local oxidation of silicon (PBLOCOS) process to fabricate field oxide regions for isolation. The method described herein includes many process steps well-known in the art like photolithography, etching or chemical vapor deposition (CVD) which are not discussed in detail. In addition, the present invention utilizes a thin thermal oxide film formed on the buffered polysilicon film to prevent pitting formation.

Figure 1:
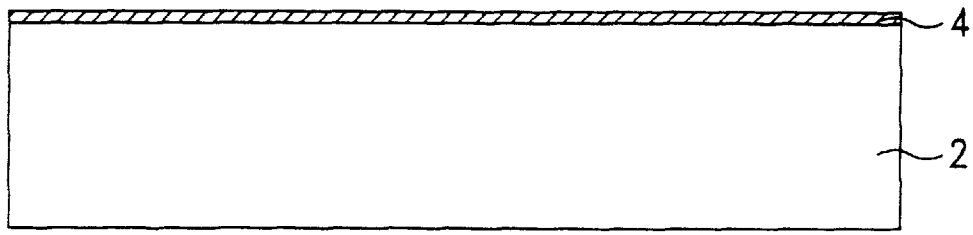
FIG. 1 is a cross-sectional view of a semiconductor wafer illustrating the step of forming ad oxide layer on the substrate according to the present invention.
Figure 2:
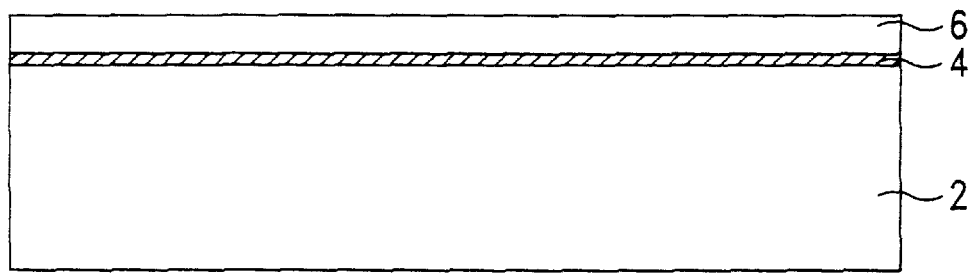
FIG. 2 cross-sectional view of a semiconductor wafer illustrating the step of forming an amorphous silicon layer on the pad oxide layer according to the present invention.

Referring to FIG. 1, a single crystal silicon substrate 2 with a <100> crystallographic orientation is provided. A thin silicon oxide layer 4 with a thickness of about 30 to 200 angstroms is formed on the surface of the substrate 2 to serve as a pad oxide. This pad oxide layer 4 can be grown by using low pressure chemical vapor deposition (LPCVD) at a temperature of about 400–750° C., or using thermal oxidation at a temperature of about 800–1100° C. An amorphous silicon layer 6 with a thickness of about 300 to 1000 angstroms is formed on the layer 4 as shown in FIG. 2. The suitable method to form this amorphous silicon layer 6 can be LPCVD at a temperature of about 400–575° C.

Figure 3:
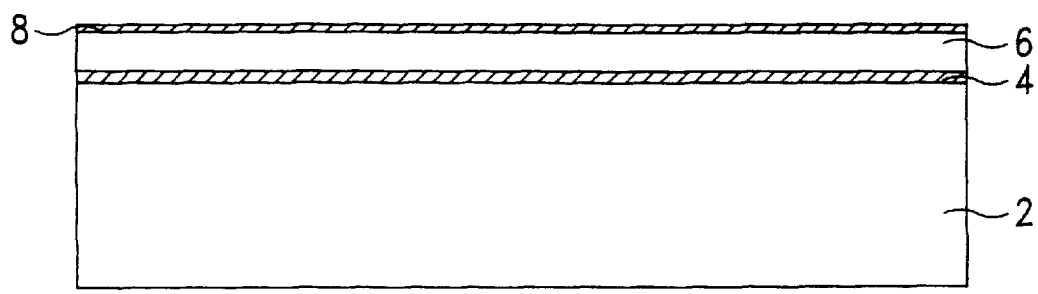
FIG. 3 is a cross-sectional view of a semiconductor wafer illustrating the step of forming a second pad oxide layer on the silicon layer according to the present invention.

Turning next to FIG. 3, a high temperature thermal oxidation is performed at a temperature of about 800–1100° C. in a dry $O_2$, $N_2O$ or NO environment. At this oxidation step, another thin pad oxide layer 8 is grown on the surface of the silicon layer 6. This second pad oxide layer 8 can be formed of silicon oxide when the $O_2$ environment is employed. It can also be formed of silicon oxynitride when the $N_2O$ or NO environment is employed. In addition to the growing of the second pad oxide layer 8, the residual portion of the amorphous silicon layer 6 is crystallized and converted into polysilicon layer. This polysilicon layer 6 serves in a PBLOCOS process as a buffered layer to reduce the oxidation-induced stress instead of the usual pad oxide layer. Now, in the present invention, the pad oxide layer 8, the polysilicon layer 6 and the pad oxide layer 4 are stacked together to act as the buffered layer.

Figure 4:
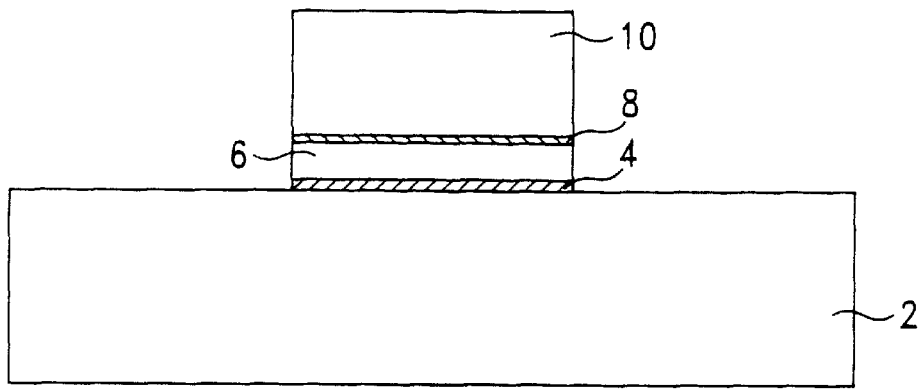
FIG 4 a cross-sectional view of a semiconductor wafer illustrating the step of forming a silicon nitride layer on the second pad oxide layer and defining the active regions according to the present invention.

Referring to FIG. 4, a silicon nitride layer 10 is then deposited, for example, using a LPCVD process at a temperature of about 600–800° C., on the stacked film of the first pad oxide layer 4, the polysilicon layer 6 and the second pad oxide layer 8. Alternatively, a plasma enhanced chemical vapor deposition (PECVD) at a temperature of about 300–500° C. can be another choice for this silicon nitride deposition. With the buffer of polysilicon layer 6 and the pad oxide layers 4 and 8, the silicon nitride layer 10 can be thicker than usual with a thickness of about 1000–4000 angstroms.

Next, the active regions are now defined on the semiconductor substrate 2 by using a conventional manner of photoresist photolithography including photoresist coating, exposure, and development processes followed by a dry etching. The thick silicon nitride layer 10 is patterned at this step to cover the active regions on the stacked buffered layer 4, 6 and 8 and expose the isolation regions. The preferable method to etch the thick silicon nitride layer 6 can be a reactive ion etching (RIE) with plasma gases containing fluoride such as $CF_4/O_2$, $CF_2/H_2$, $CHF_3$ or $NF_3$. Optionally, the second pad oxide layer 8, the polysilicon layer 6 and the first pad oxide 4 can also be etched with the same isolation pattern. The method to etch the first and second pad oxide layer 4 is a dry etching with plasma gases such as $CF_4$, $CHF_3$, $C_2F_6$ or $C_3F_8$. The polysilicon can be etched by plasma source containing $Cl_2$, $BCl_3$, HBr, $SF_6$ or $SiCl_4$.

Figure 5:
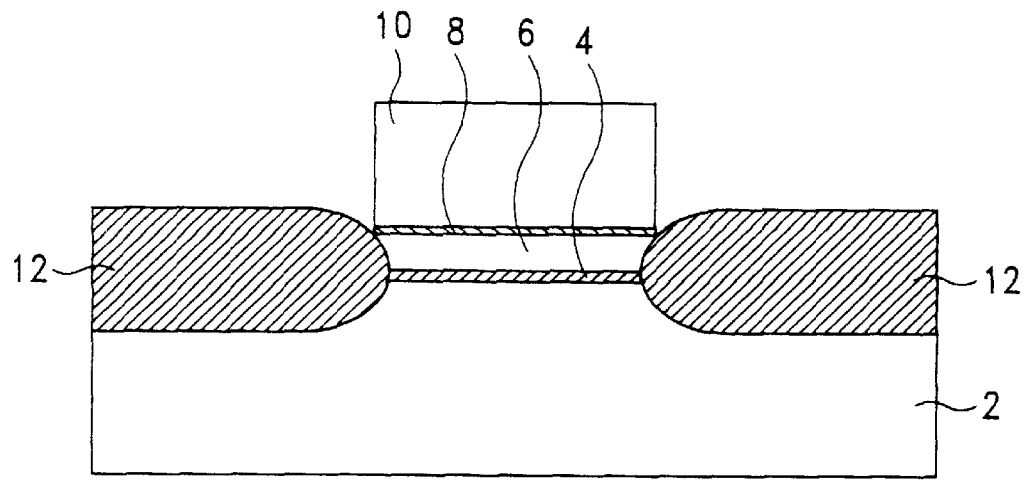
FIG. 5 is a cross-sectional view of a semiconductor wafer illustrating the step of performing a thermal oxidation to grow thick field oxide layers according to the present invention.

Next, after the photoresist is removed and wet cleaned, the field oxide regions 12 are grown on the semiconductor substrate 2 by applying a high temperature oxidation using the thick silicon nitride layer as an oxidation mask. At this thermal step, a temperature of about 800–1100° C. is employed. Regardless of whether the portions of the second pad oxide layer 8, the polysilicon layer 6, and the first oxide layer 4 on the isolation regions exposed by the masking nitride layer 10 are stripped or not, the resultant field oxide regions 12 are grown to have a cross-section view as shown in FIG. 5, because oxygen can pass through the first and second pad oxide layer and oxidize these portions of the polysilicon layer. The white-ribbon effect, which is caused by chemical reaction of water, ammonia and silicon, would be suppressed through the silicon oxide layer buffer 8 between masking nitride layer 10 and polysilicon layer 6. The pit formation and white ribbon induced on the semiconductor substrate 2 can thus be reduced.

Thereafter, the masking silicon nitride layer 10 is removed by a wet etching using hot solution of phosphoric acid ($H_3PO_4$) as the etchant. During this wet nitride etching process, the pad oxide layer 8 provides the protection to prevent the underlying polysilicon layer from attack by the wet etchant which could result in damage of the semiconductor substrate. Then, the stacked buffered layer, the pad oxide layer 8, the polysilicon layer 6 and the pad oxide layer 4 are subsequently stripped. A wet etching using buffered oxide-etching (BOE) solution or diluted solution of hydrofluoric acid (HF) as the etchant is preferable for the oxide etching. And the polysilicon layer 6 can be etched by the wet etching solution mixed with Nitric acid ($HNO_3$) and hydrofluoric acid (HF). Another substitutional choice for polysilicon etching can be a solution containing KOH.

Figure 6:
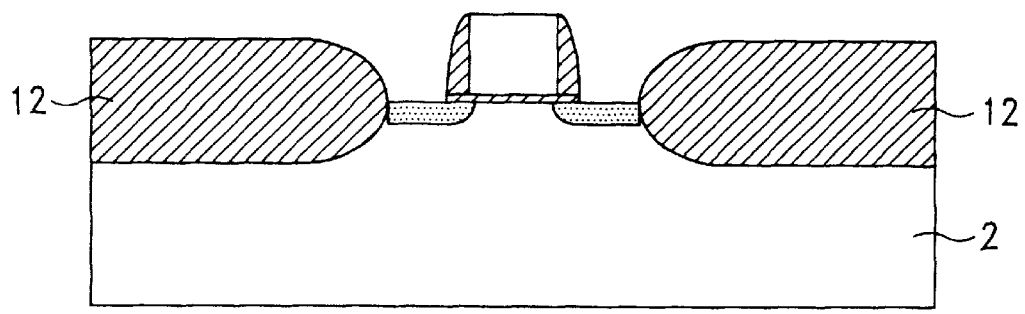
FIG. 6 is a cross-sectional view of a semiconductor wafer illustrating the step of fabricating MOSFET on the substrate according to the present invention.

Finally, referring to FIG. 6, the gate oxide layer 14 is regrown on the semiconductor substrate 2. Then the active devices that consist of gates, sources and drains are formed on the active regions to finish the fabrication of the MOS transistor.

According to the above processes, the isolation regions of field oxide 12, are formed in a semiconductor substrate 2 to provide isolation among active devices. With the use of the polysilicon buffered layer 6, the bird's beak can be reduced. With the function of the pad oxide layer 8, the pit formation and the white ribbon caused from wet oxidation are minimized, and the damage induced by the nitride wet etching will also be avoided. By solving these problems raised from the conventional LOCOS isolation technique, the integration of semiconductor fabrication can be increased, and the method of the present invention can be applied in deep sub-micron CMOS devices with a better yield.

As is understood by a person skilled in the art, the foregoing preferred embodiments of the present invention are illustrative of the present invention rather than limiting of the present invention. It is intended to cover various modifications and similar arrangements included within the spirit and scope of the appended claims, the scope of which should be accorded the broadest interpretation so as to encompass all such modifications and similar structures.

What is claimed is:

1. A method for forming isolation regions on a semiconductor substrate, said method comprising the steps of:

forming a first pad oxide layer on said semiconductor substrate;

forming a silicon layer on said first pad oxide layer;

forming a second pad oxide layer on the surface of said silicon layer;

forming a silicon nitride layer on said second pad oxide layer;

patterning said silicon nitride layer to define active regions on said semiconductor substrate, thereby exposing portions of said second oxide layer which defines said isolation region; and performing an oxidation to form isolation oxide regions on said semiconductor substrate by using said patterned silicon nitride layer as an oxidation mask, wherein portions of said silicon layer and said semiconductor substrate exposed by said patterned silicon nitride layer are oxidized with oxygen passing through portions of said second pad oxide layer and said first pad oxide layer exposed by said patterned silicon nitride layer.

2. The method according to claim 1, wherein said first pad oxide layer is formed with a thickness of about 30 to 200 angstroms by a method selected from the group consisting of substrate oxidation and LPCVD.

3. The method according to claim 1, wherein said silicon layer is formed of a material selected from the group consisting of amorphous silicon and polysilicon with a thickness of about 300 to 1000 angstroms.

4. The method according to claim 1, wherein said second pad oxide layer is formed by oxidation at a temperature of about 800 to 1100° C. in an environment containing gases selected from the group consisting of $O_2$, $N_2O$ and NO, and whereby said silicon layer is converted into a polysilicon layer simultaneously.

5. The method according to claim 1, further comprising the step of patterning said second pad oxide layer, said silicon layer and said first pad oxide layer using said patterned silicon nitride layer as an etching mask before said oxidation is performed, thereby exposing a portion of said semiconductor substrate which defines said isolation region.

6. The method according to claim 1, wherein said oxidation is performed at a temperature of about 800 to 1100° C. in a wet oxygen environment.

7. The method according to claim 1, further comprising the step of removing said silicon nitride layer, said second pad oxide layer, said silicon layer and said first pad oxide layer after said oxidation is performed.

8. A method for forming isolation regions on a semiconductor substrate, said method comprising the steps of:

forming a first pad oxide layer on said semiconductor substrate;

forming a silicon layer on said first pad oxide layer;

performing a first oxidation to convert said silicon layer into polysilicon layer and grow a second pad oxide layer on the surface of said polysilicon layer;

forming a silicon nitride layer on said second pad oxide layer;

patterning said silicon nitride layer to define active regions on said semiconductor substrate, thereby exposing portions of said second oxide layer which defines said isolation region; and performing a second oxidation to form isolation oxide regions on said semiconductor substrate by using said patterned silicon nitride layer as an oxidation mask, wherein portions of said silicon layer and said semiconductor substrate exposed by said patterned silicon nitride layer are oxidized with oxygen passing through portions of said second pad oxide layer and said first pad oxide layer exposed by said patterned silicon nitride layer.

9. The method according to claim 8, wherein said first pad oxide layer is formed with a thickness of about 30 to 200 angstroms by a method selected from the group consisting of substrate oxidation and LPCVD.

10. The method according to claim 8, wherein said silicon layer is formed with a thickness of about 300 to 1000 angstroms.

11. The method according to claim 8, wherein said first oxidation is performed at a temperature of about 800 to 1100° C. in an environment containing gases selected from the group consisting of $O_2$, $N_2O$ and NO.

12. The method according to claim 8, further comprising the step of patterning said second pad oxide layer, said silicon layer and said first pad oxide layer using said patterned silicon nitride layer as an etching mask before said second oxidation is performed, thereby exposing a portion of said semiconductor substrate which defines said isolation region.

13. The method according to claim 8, wherein said second oxidation is performed at a temperature of about 800 to 1100° C. in a wet oxygen environment.

14. The method according to claim 8, further comprising the step of removing said silicon nitride layer, said second pad oxide layer, said polysilicon layer and said first pad oxide layer after said second oxidation is performed.

15. A method for forming isolation regions on a semiconductor substrate, said method comprising the steps of:

forming a first pad oxide layer on said semiconductor substrate;

forming a silicon layer on said first pad oxide layer;

forming a second pad oxide layer on the surface of said silicon layer;

forming a silicon nitride layer on said second pad oxide layer;

patterning said silicon nitride layer, said second pad oxide layer, said silicon layer and said first pad oxide layer to define active regions on said semiconductor substrate by exposing said isolation regions; and performing an oxidation to form isolation oxide regions on said isolation regions of said semiconductor substrate.

16. The method according to claim 15, wherein said first pad oxide layer is formed with a thickness of about 30 to 200 angstroms by a method selected from the group consisting of substrate oxidation and LPCVD.

17. The method according to claim 15, wherein said silicon layer is formed of a material selected from the group consisting of amorphous silicon and polysilicon, said silicon oxide layer having a thickness of about 300 to 1000 angstroms.

18. The method according to claim 1, wherein said second pad oxide layer is formed by oxidation at a temperature of about 800 to 1100° C. in an environment containing gases selected from the group consisting of $O_2$, $N_2O$ and NO, and whereby said silicon layer is converted into polysilicon layer simultaneously.

19. The method according to claim 1, wherein said oxidation is performed at a temperature of about 800 to 1100° C. in a wet oxygen environment.

20. The method according to claim 1, further comprising the step of removing the residual portions of said silicon nitride layer, said second pad oxide layer, said silicon layer and said first pad oxide layer.

* * * * *